United States Patent
Plach et al.

(10) Patent No.: US 10,825,793 B2
(45) Date of Patent: Nov. 3, 2020

(54) METHOD FOR PERMANENTLY BONDING WAFERS

(75) Inventors: Thomas Plach, Linz (AT); Kurt Hingerl, Wolfern (AT); Markus Wimplinger, Ried im Innkreis (AT); Christoph Flötgen, Pramerdorf (AT)

(73) Assignee: EV Group E. Thallner GmbH

( * ) Notice: Subject to any disclaimer, the term of this patent is extended or adjusted under 35 U.S.C. 154(b) by 0 days.

(21) Appl. No.: 14/007,999

(22) PCT Filed: Apr. 8, 2011

(86) PCT No.: PCT/EP2011/055470
§ 371 (c)(1),
(2), (4) Date: Sep. 27, 2013

(87) PCT Pub. No.: WO2012/136267
PCT Pub. Date: Oct. 11, 2012

(65) Prior Publication Data
US 2014/0017877 A1    Jan. 16, 2014

(51) Int. Cl.
*H01L 21/20* (2006.01)
*H01L 23/00* (2006.01)
(Continued)

(52) U.S. Cl.
CPC ............ *H01L 24/83* (2013.01); *H01L 21/187* (2013.01); *H01L 21/2007* (2013.01);
(Continued)

(58) Field of Classification Search
CPC .......................... H01L 21/2007; H01L 21/187
(Continued)

(56) References Cited

U.S. PATENT DOCUMENTS

| 5,146,137 A | 9/1992 | Gesche et al. ............ 315/111.21 |
| 5,427,638 A | 6/1995 | Goetz et al. .................. 156/153 |

(Continued)

FOREIGN PATENT DOCUMENTS

| CN | 101138071 A | 3/2008 | |
| CN | 101261932 A | 9/2008 | ............... B81C 1/00 |

(Continued)

OTHER PUBLICATIONS

Suni, T., et al., "Effects of Plasma Activation on Hydrophilic Bonding of Si and SiO2," Journal of The Electrochemical Society, Manchester, New Hampshire, U.S., vol. 149, No. 6, Jun. 1, 2002; pp. G348-G351. (XP008046162).

(Continued)

*Primary Examiner* — Bradley Smith
(74) *Attorney, Agent, or Firm* — Kusner & Jaffe (57) ABSTRACT

This invention relates to a method for bonding of a first contact surface of a first substrate to a second contact surface of a second substrate with the following steps, especially the following sequence:
forming a reservoir in a surface layer on the first contact surface, the first surface layer consisting at least largely of a native oxide material,
at least partial filling of the reservoir with a first educt or a first group of educts,
the first contact surface making contact with the second contact surface for formation of a prebond connection,
forming a permanent bond between the first and second contact surface, at least partially strengthened by the reaction of the first educt with a second educt contained in a reaction layer of the second substrate.

8 Claims, 3 Drawing Sheets

(51) Int. Cl.
*H01L 21/762* (2006.01)
*H01L 21/3105* (2006.01)
*H01L 21/18* (2006.01)
*H01L 21/02* (2006.01)

(52) U.S. Cl.
CPC .... *H01L 21/3105* (2013.01); *H01L 21/76251* (2013.01); *H01L 24/27* (2013.01); *H01L 24/29* (2013.01); *H01L 24/32* (2013.01); *H01L 21/0223* (2013.01); *H01L 21/02255* (2013.01); *H01L 2224/278* (2013.01); *H01L 2224/27444* (2013.01); *H01L 2224/29188* (2013.01); *H01L 2224/32145* (2013.01); *H01L 2224/8309* (2013.01); *H01L 2224/83896* (2013.01); *H01L 2924/01013* (2013.01); *H01L 2924/1032* (2013.01); *H01L 2924/1033* (2013.01); *H01L 2924/1082* (2013.01); *H01L 2924/10252* (2013.01); *H01L 2924/10328* (2013.01); *H01L 2924/10329* (2013.01); *H01L 2924/10331* (2013.01); *H01L 2924/10332* (2013.01); *H01L 2924/10333* (2013.01); *H01L 2924/10334* (2013.01); *H01L 2924/10335* (2013.01); *H01L 2924/10336* (2013.01); *H01L 2924/10346* (2013.01); *H01L 2924/10821* (2013.01); *H01L 2924/10823* (2013.01); *H01L 2924/20106* (2013.01)

(58) Field of Classification Search
USPC .......................................................... 438/455
See application file for complete search history.

(56) References Cited

U.S. PATENT DOCUMENTS

| | | | |
|---|---|---|---|
| 5,451,547 A | 9/1995 | Himi et al. | 437/225 |
| 6,022,460 A | 2/2000 | O et al. | 204/298.6 |
| 7,041,178 B2 | 5/2006 | Tong et al. | 148/33.4 |
| 7,109,092 B2 | 9/2006 | Tong | |
| 7,419,884 B2 | 9/2008 | Kerdiles | 438/455 |
| 7,642,112 B2 | 1/2010 | Atoji et al. | 438/33 |
| 7,670,708 B2 | 3/2010 | Yamada et al. | 429/34 |
| 7,686,912 B2 | 3/2010 | Suga et al. | 156/273.3 |
| 7,745,309 B2 | 6/2010 | Thakur et al. | 438/458 |
| 7,943,414 B2 | 5/2011 | Shimomura et al. | 438/58 |
| 8,641,859 B2 | 2/2014 | Richter | |
| 8,975,158 B2 | 3/2015 | Plach et al. | 438/455 |
| 9,159,717 B2 | 10/2015 | Plach et al. | 438/455 |
| 2002/0048900 A1 | 4/2002 | Lo et al. | 438/455 |
| 2003/0003684 A1 | 1/2003 | Farrens et al. | 438/455 |
| 2003/0079822 A1 | 5/2003 | Sabia | 156/99 |
| 2003/0089950 A1 | 5/2003 | Kuech et al. | 257/352 |
| 2003/0094443 A1 | 5/2003 | Barnett | |
| 2003/0141502 A1 | 7/2003 | Tong | 257/52 |
| 2003/0211705 A1 | 11/2003 | Tong et al. | 438/455 |
| 2004/0132304 A1 | 7/2004 | Farrens et al. | |
| 2004/0171231 A1 | 9/2004 | Yanagita et al. | 438/455 |
| 2006/0032582 A1 | 2/2006 | Chen et al. | 156/272.6 |
| 2006/0037701 A1 | 2/2006 | Koshiishi et al. | 156/345.44 |
| 2006/0043483 A1 | 3/2006 | Shaheen et al. | 257/347 |
| 2006/0240642 A1* | 10/2006 | Kerdiles | 438/455 |
| 2006/0260642 A1 | 11/2006 | Verhaverbeke et al. | 134/1.3 |
| 2007/0020947 A1 | 1/2007 | Daval et al. | 438/758 |
| 2007/0272349 A1 | 11/2007 | Chen et al. | |
| 2008/0006369 A1 | 1/2008 | Lim et al. | 156/308.6 |
| 2008/0038900 A1 | 2/2008 | Thakur et al. | 438/455 |
| 2008/0171443 A1 | 7/2008 | Hebras | |
| 2009/0029058 A1 | 1/2009 | Grasboeck et al. | 427/386 |
| 2009/0098709 A1 | 4/2009 | Ohnuma et al. | 438/458 |
| 2009/0111243 A1 | 4/2009 | Landru et al. | 438/458 |
| 2009/0139963 A1 | 6/2009 | Panagopoulos et al. | |
| 2009/0261064 A1 | 10/2009 | Kerdiles et al. | 216/34 |
| 2009/0294072 A1 | 12/2009 | Kerdiles et al. | 156/380.9 |
| 2010/0029058 A1 | 2/2010 | Shimomura et al. | 438/458 |
| 2010/0112824 A1 | 5/2010 | Yokokawa et al. | 438/770 |
| 2010/0193897 A1 | 8/2010 | Sinha et al. | 257/506 |
| 2010/0248447 A1 | 9/2010 | Nishihata et al. | 438/459 |
| 2011/0039395 A1 | 2/2011 | Ohnuma et al. | |
| 2012/0275981 A1 | 11/2012 | Foord et al. | 423/274 |
| 2013/0207098 A1 | 8/2013 | Yeh et al. | 257/43 |
| 2013/0207244 A1* | 8/2013 | David et al. | 257/632 |
| 2013/0299080 A1 | 11/2013 | Plach et al. | 156/272.6 |
| 2015/0165752 A1 | 6/2015 | Plach et al. | 216/36 |

FOREIGN PATENT DOCUMENTS

| | | | |
|---|---|---|---|
| CN | 101317258 A | 12/2008 | ......... H01L 21/762 |
| CN | 101789354 B | 7/2012 | |
| CN | 102265389 B | 4/2014 | |
| EP | 0 434 932 A2 | 7/1991 | .............. H05H 1/46 |
| EP | 0 584 778 | 3/1994 | ............ H01L 21/20 |
| EP | 2370997 B1 | 11/2009 | |
| EP | 2 151 851 A1 | 2/2010 | ............ H01L 21/02 |
| EP | 2 211 369 A1 | 7/2010 | |
| JP | H0582404 A | 4/1993 | |
| JP | H05-166690 A | 7/1993 | ............ H01L 21/02 |
| JP | 2003-523627 A | 8/2003 | ............ H01L 21/02 |
| JP | 2005-093753 A | 4/2005 | ............. H01G 4/12 |
| JP | 2006-080314 A | 3/2006 | ............ H01L 21/02 |
| JP | 2006-258958 A | 9/2006 | |
| JP | 2007-012583 | 1/2007 | ............. H01M 8/02 |
| JP | 2007-515779 A | 6/2007 | |
| JP | 2008-513975 | 5/2008 | ............ H01L 24/29 |
| JP | 2008-535230 | 8/2008 | ............ H01L 21/02 |
| JP | 2009-517855 A | 4/2009 | ............ H01L 21/02 |
| JP | 2009-111381 A | 5/2009 | ............ H01L 21/02 |
| JP | 2010-500761 A | 1/2010 | ............ H01L 21/02 |
| JP | 2010-056543 A | 3/2010 | ............ H01L 21/02 |
| JP | 2011-249643 A | 12/2011 | |
| JP | 5166690 | 3/2013 | ............. H01M 8/02 |
| JP | 2014-510391 A | 4/2014 | ............ H01L 21/02 |
| KR | 20050022953 | 3/2005 | ............ H01L 21/02 |
| KR | 10-2007-0114769 | 12/2007 | ......... H01L 21/203 |
| TW | 200425235 A | 11/2004 | ............ H01L 21/00 |
| TW | 200710971 A | 3/2007 | ............ H01L 21/30 |
| TW | I305010 B | 1/2009 | ............ H01L 21/02 |
| WO | WO 2001/061743 | 8/2001 | ............ H01L 21/48 |
| WO | WO 2002/013247 A1 | 2/2002 | ............ H01L 21/30 |
| WO | WO 2006/020439 A1 | 2/2006 | |
| WO | WO 2006/093817 | 9/2006 | |
| WO | WO 2006/111533 A1 | 10/2006 | ............ H01L 21/18 |
| WO | WO 2007/060145 | 5/2007 | ......... H01L 21/762 |
| WO | WO 2008/114099 | 9/2008 | ........ H01L 21/2007 |
| WO | WO 2009/031392 A1 | 3/2009 | ............ H01L 21/02 |
| WO | WO 2010/057842 A1 | 5/2010 | |

OTHER PUBLICATIONS

Weinert, A., et al., "Plasma Assisted Room Temperature Bonding for MST," Sensors and Actuators A, Elsevier Sequoia S.A., Lausanne, CH, vol. 92, No. 1-3, Aug. 1, 2001; pp. 214-222.
Int'l Search Report from corresponding PCT/EP2011/055470 (Form PCT/ISA/210); 3 pages.
U.S. Appl. No. 14/976,484, filed Dec. 21, 2015, Plach, entitled: Method for Permanent Bonding of Wafers.
International Search Report for related PCT/EP2011/000299 dated Oct. 10, 2011.
International Search Report for related PCT/EP2011/055469 dated Dec. 1, 2012.
International Search Report for related PCT/EP2011/055471 dated Dec. 1, 2012.
International Search Report for related PCT/EP2012/064545 dated May 14, 2013.
Office Action issued in connection with related Taiwanese Patent Application No. 101102642 dated Sep. 3, 2015 (with English-language translation).
Holleman-Wilberg, "The Nitrogen Group," Inorganic Chemistry, 1st Edition, Chapter XIV, Nov. 5, 2001, pp. 598, 600-604, and 609-613.

(56) References Cited

OTHER PUBLICATIONS

Office Action issued in connection with related Japanese Patent Application No. 2015-523424 dated May 27, 2016.
Search Report from related Taiwanese Patent Application No. 102126540 dated Jul. 7, 2016. (English-language translation provided).
Office Action issued in connection with related Taiwanese Patent Application No. 102126540 dated Jul. 13, 2016.
Search Report from related Singapore Patent Application No. 10201510783T dated Jul. 7, 2016.
Written Opinion from related Singapore Patent Application No. 10201510783T dated Jul. 7, 2016.
Dragoi, V. et al., "Low temperature wafer bonding for microsystems applications," *Semiconductor Conference, CAS 2004 Proceedings*, Oct. 4, 2004, vol. 1, pp. 199-202, Sections 2 Experimental.
Office Action issued in corresponding U.S. Appl. No. 14/414,795 dated Mar. 13, 2017.
Office Action issued in corresponding U.S. Appl. No. 14/414,795, dated Dec. 28, 2016.
Holleman-Wilberg, *Inorganic Chemistry*, 1st Edition, Chapter XIV, Nov. 5, 2001, pp. 600, 822 and 1361.
Written Opinion issued in related Singapore Patent Application No. 2014009930 dated Sep. 23, 2016.
Office Action issued in corresponding U.S. Appl. No. 15/499,011 dated Jun. 26, 2017.
Sanz-Velasco, A. et al., "Room Temperature Wafer Bonding Using Oxygen Plasma Treatment in Reactive Ion Etchers With and Without Inductively Couple Plasma," *Journal of The Electrochemical Society*, 150(2), G155-G162, (2003).
Office Action issued in corresponding U.S. Appl. No. 16/106,326 dated Jan. 10, 2020.
Taillet J., Plasma physics: ion energy in RF plasma etching, Journal de Physique Lettres, Edp sciences, 1979, 40 (11), pp. 223-225.
Budtz-Jorgensen C., Studies of Electrical Plasma Discharges, Faculty of Science, Aarhus University, Denmark, submitted on Jan. 11, 2001.

\* cited by examiner

METHOD FOR PERMANENTLY BONDING WAFERS

FIELD OF THE INVENTION

This invention relates to a method for bonding of a first contact surface of a first substrate to a second contact surface of a second substrate.

BACKGROUND OF THE INVENTION

The objective in permanent or irreversible bonding of substrates is to produce an interconnection, which is as strong and especially as irreversible as possible, i.e., a high bond force, between the two contact surfaces of the substrates. There are various approaches and production methods for this purpose in the prior art.

The known production methods and the approaches which have been followed to date often lead to results which cannot be reproduced or can be poorly reproduced and which can hardly be applied especially to altered conditions. In particular, production methods which are used at present often use high temperatures, especially >400° C., in order to ensure reproducible results.

Technical problems such as high energy consumption and a possible destruction of structures which are present on the substrates result from the high temperatures, to some extent far above 300° C., which have been necessary to date for a high bond force.

Other demands include the following:
front-end-of-line compatibility.

This is defined as the compatibility of the process during the production of the electrically active components. In this respect, the bonding process must be designed such that active components such as transistors, which are already present on the structure wafers, are neither adversely affected nor damaged during the processing. Compatibility criteria include mainly the purity of certain chemical elements (mainly in CMOS structures) and mechanical loadability, mainly by thermal stresses.

low contamination.
no application of force.
temperature as low as possible, especially for materials with different coefficients of thermal expansion.

The reduction of the bond force leads to more careful treatment of the structure wafer and thus to a reduction of the failure probability by direct mechanical loading.

SUMMARY OF THE INVENTION

The object of this invention is therefore to devise a method for careful production of a permanent bond with a bond force which is as high as possible and, at the same time at a temperature which is as low as possible.

This object is achieved with the features of Claim 1. Advantageous developments of the invention are given in the dependent claims. All combinations of at least two of the features given in the specification, the claims and/or the figures also fall within the framework of the invention. At the given value ranges, values within the indicated limits will also be considered to be disclosed as boundary values and will be claimed in any combination.

The present invention provides a reservoir for holding a first educt on at least one of the substrates, which educt reacts after making contact, or producing a temporary bond between the substrates, with a second educt which is present in the other substrate, and which thus forms an irreversible or permanent bond between the substrates. Before or after forming the reservoir in one surface layer on the first contact surface, generally cleaning of the substrate or substrates occurs, preferably by a flushing step. This cleaning should generally ensure that there are no particles on the surfaces which would result in unbonded sites. The surface layer as claimed in the invention is comprised mostly of a native material, especially an oxide material, preferably of a native silicon dioxide. A layer of native material can be made especially thin so that the reactions provided as claimed in the invention (first educt or first group with a second educt or a second group), especially diffusion processes, due to the reduced distances between the reaction partners, can proceed especially promptly. On the opposing second contact surface as claimed in the invention there can be a growth layer in which the deformation as claimed in the invention takes place and the first educt (or the first group) reacts with the second educt (or the second group) present in the reaction layer of the second substrate. To accelerate the reaction between the first educt (or the first group) and the second educt (or the second group) it can be provided as claimed in the invention that the growth layer located between the reaction layer of the second substrate and the reservoir be thinned before the substrates make contact since in this way the distance between the reaction partners is reduced and at the same time the deformation/formation of the growth layer as claimed in the invention is promoted. The growth layer is removed at least partially, especially mostly, preferably completely, by the thinning. The growth layer grows again in the reaction of the first educt with the second educt even if it has been completely removed.

As claimed in the invention there can be means for inhibiting the growth of the growth layer before the contact surfaces make contact, especially by passivation of the reaction layer of the second substrate, preferably by exposure to $N_2$, forming gas or an inert atmosphere or under a vacuum or by amorphization. In this connection treatment with plasma which contains forming gas, especially consists largely of forming gas, has proven especially suitable. Here forming gas is defined as gases which contain at least 2%, better 4%, ideally 10% to 15% hydrogen. The remaining portion of the mixture consists of an inert gas such as for example nitrogen or argon.

Alternatively or in addition to this measure, it is advantageous as claimed in the invention to minimize the time between the thinning and the formation of the reservoir/reservoirs and the contact-making, especially <2 hours, preferably <30 minutes, even more preferably <15 minutes, ideally <5 minutes.

The diffusion rate of the educts through the growth layer is increased by the growth layer (which has been optionally thinned and thus is very thin at least at the beginning of the formation of the permanent bond or at the start of the reaction). This leads to a shorter transport time of the educts at the same temperature.

The reservoir and the educt contained in the reservoir create the technical possibility of inducing a reaction which increases the bonding speed and strengthens the permanent bond directly on the contact surfaces after producing the temporary or reversible bond in a controlled manner, especially by deforming at least one of the contact surfaces by the reaction, preferably the contact surface opposite the reservoir.

The formation of the reservoir, especially by plasma activation, is chosen as claimed in the invention such that bubble formation is avoided. Preferably for plasma activation, ions of gas molecules are used which are at the same time suitable for reaction with the second educt, especially correspond to the first educt. This results in that possible byproducts which could arise in the reaction of the first educt with the second educt are avoided.

The size of the reservoir is set as claimed in the invention such that pores on the contact surface between the substrates can be closed as completely as possible by means of the growth of the growth layer. That is, the reservoir must be large enough to be able to hold enough of the first educt in order to be able to produce therewith a relatively thick/voluminous growth layer by reaction of the first educt with the second educt which is present in the reaction layer. The size must however be small enough to accommodate as little excess first educt as possible which cannot react with the reaction layer. This largely prevents or precludes bubble formation.

In-situ processing is advantageously carried out to intercalate an educt as pure as possible in the reservoir, and nonreacting species are excluded as much as possible.

For the prebonding step, for producing a temporary or reversible bond between the substrates there are various possibilities with the objective of producing a weak interaction between the contact surfaces of the substrates. The prebond strengths are below the permanent bond strengths, at least by a factor of 2 to 3, especially by a factor of 5, preferably by a factor of 15, still more preferably by a factor of 25. As guideline values the prebond strengths of pure, nonactivated, hydrophilized silicon with roughly 100 mJ/m$^2$ and of pure, plasma-activated hydrophilized silicon with roughly 200-300 mJ/m$^2$ are mentioned. The prebonds between the molecule-wetted substrates arise mainly due to the van-der-Waals interactions between the molecules of the different wafer sides. Accordingly, mainly molecules with permanent dipole moments are suitable for enabling prebonds between wafers. The following chemical compounds are mentioned as interconnect agents by way of example, but not limited thereto
    water
    thiols
    AP3000
    silanes and/or
    silanols.

Suitable substrates as claimed in the invention are those whose material is able to react as an educt with another supplied educt to form a product with a higher molar volume, as a result of which the formation of a growth layer on the substrate is caused. The following combinations are especially advantageous, to the left of the arrow the educt being named and to the right of the arrow, the product/products, without the supplied educt or byproducts which react with the educt being named in particular:
    Si→$SiO_2$, $Si_3N_4$, $SiN_xO_y$,
    Ge→$GeO_2$, $Ge_3N_4$
    α-Sn→$SnO_2$
    B→$B_2O_3$, BN
    Se→$SeO_2$
    Te→$TeO_2$, $TeO_3$
    Mg→MgO, $Mg_3N_2$
    Al→$Al_2O_3$, AlN
    Ti→$TiO_2$, TiN
    V→$V_2O_5$
    Mn→MnO, $MnO_2$, $Mn_2O_3$, $Mn_2O_7$, $Mn_3O_4$
    Fe→FeO, $Fe_2O_3$, $Fe_3O_4$
    Co→COO, $CO_3O_4$,
    Ni→NiO, $Ni_2O_3$
    Cu→CuO, $Cu_2O$, $Cu_3N$
    Zn→ZnO
    Cr→CrN, $Cr_{23}C_6$, $Cr_3C$, $Cr_7C_3$, $Cr_3C_2$
    Mo→$Mo_3C_2$
    Ti→TiC
    Nb→$Nb_4C_3$
    Ta→$Ta_4C_3$
    Zr→ZrC
    Hf→HfC
    V→$V_4C_3$, VC
    W→$W_2C$, WC
    Fe→$Fe_3C$, $Fe_7C_3$, $Fe_2C$ The following mixed forms of semiconductors are also conceivable as substrates:
    III-V: GaP, GaAs, InP, InSb, InAs, GaSb, GaN, AlN, InN, $Al_xGa_{1-x}As$, $In_xGa_{1-x}N$
    IV-IV: SiC, SiGe,
    III-IV: InAlP,
    nonlinear optics: $LiNbO_3$, $LiTaO_3$, KDP ($KH_2PO_4$)
    solar cells: CdS, CdSe, CdTe, $CuInSe_2$, $CuInGaSe_2$, $CuInS_2$, $CuInGaS_2$
    conductive oxides: $In_{2-x}SnxO_{3-y}$

As claimed in the invention, on at least one of the wafers and directly on the respective contact surface there is the reservoir (or reservoirs) in which a certain amount of at least one of the supplied educts for the volume expansion reaction can be stored. Educts can therefore be for example $O_2$, $O_3$, $H_2O$, $N_2$, $NH_3$, $H_2O_2$, etc. Due to the expansion, especially dictated by oxide growth, based on the tendency of the reaction partners to reduce system energy, possible gaps, pores, and cavities between the contact surfaces are minimized and the bond force is increased accordingly by narrowing the distances between the substrates in these regions. In the best possible case the existing gaps, pores and cavities are completely closed so that the entire bonding area increases and thus the bond force as claimed in the invention rises accordingly.

The contact surfaces conventionally show a roughness with a quadratic roughness ($R_q$) of 0.2 nm. This corresponds to peak-to-peak values of the surfaces in the range of 1 nm. These empirical values were determined with Atomic Force Microscopy (AFM).

The reaction as claimed in the invention is suitable for allowing the growth layer to grow by 0.1 to 0.3 nm for a conventional wafer surface of a circular wafer with a diameter of 200 to 300 mm with 1 monolayer (ML) of water.

As claimed in the invention it is therefore provided that at least 2 ML, preferably at least 5 ML, even more preferably at least 10 ML of fluid, especially water, be stored in the reservoir.

The formation of the reservoir by exposure to plasma is especially preferable, since plasma exposure causes smoothing of the contact surface and hydrophilization as synergy effects. The surface is smoothed by plasma activation predominantly by a viscous flow of the material of the surface layer. The increase of the hydrophilicity takes place especially by the increase of the silicon hydroxyl compounds, preferably by cracking of Si—O compounds present on the surface, such as Si—O—Si, especially according to the following reaction:

Si—O—Si+$H_2O$ ↔ 2SiOH

Another side effect, especially as a result of the aforementioned effects, consists in that the prebond strength is improved especially by a factor of 2 to 3.

The reservoir in the surface layer on the first contact surface of the first substrate (and optionally of a second reservoir in the surface layer on the second contact surface of the second substrate) is formed for example by plasma activation of the first substrate which has been coated with a native oxide, especially silicon dioxide. Advantageously the second surface of the second surface is also activated or an additional reservoir is formed to which the features described for the first reservoir apply analogously. The plasma activation is carried out in a vacuum chamber in order to be able to adjust the conditions necessary for the plasma. As claimed in the invention, for the plasma discharge, $N_2$ gas, $O_2$ gas or argon gas with ion energies in the range from 0 to 2000 eV is used, as a result of which a reservoir is produced with a depth of up to 10 nm, preferably up to 5 nm, more preferably up to 3 nm, of the treated surface, in this case the first contact surface. As claimed in the invention, any particle type, atoms and/or molecules which are suitable for producing the reservoir can be used. Preferably those atoms and/or molecules are used that produce the reservoir with the required properties. The relevant properties are mainly the pore size, pore distribution and pore density. Alternatively, as claimed in the invention gas mixtures such as for example air or forming gas consisting of 95% Ar and 5% $H_2$ can be used. Depending on the gas used, in the reservoir during the plasma treatment among others the following ions are present: $N+$, $N_2+$, $O+$, $O_2+$, $Ar+$. The first educt can be accommodated in the unoccupied free space of the reservoir/reservoirs. The surface layer and accordingly the reservoir can extend into the reaction layer.

Advantageously there are different types of plasma species which can react with the reaction layer and comprise at least partially, preferably mostly of the first educt. To the extent the second educt is Si/Si, an $O_x$ plasma species would be advantageous.

Advantageously, oxygen ions are mainly used since they can react with Si to form silicon oxide and therefore do not bond again into oxygen molecules. The preferred bonding to silicon prevents oxygen gas from leading to bubble formation after the bond process. Analogous considerations apply to the other substrate—gas combinations. Generally therefore, the ion species which can bond more easily in the system and which has a very low tendency, or none at all, to pass into the gaseous state is always preferred.

The reservoir is formed based on the following considerations: The pore size is smaller than 10 nm, preferably smaller than 5 nm, more preferably smaller than 1 nm, even more preferably smaller than 0.5 nm, most preferably smaller than 0.2 nm.

The pore density is preferably directly proportional to the density of the particles which produce the pores by striking action, most preferably can even be varied by the partial pressure of the striking species, and depending on the treatment time and the parameter, especially of the plasma system used.

Figure 7:
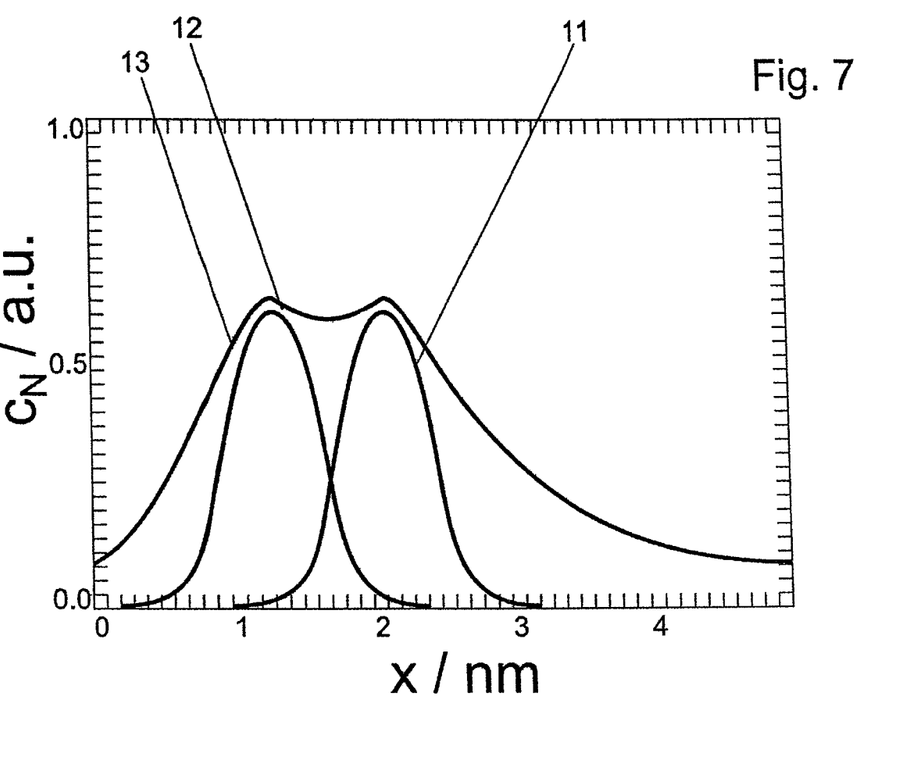
FIG. 7 shows a diagram of the production of the reservoir as claimed in the invention.

The pore distribution preferably has at least one region of greatest pore concentration under the surface, by variation of the parameters of several such regions which are superimposed into a preferably plateau-shaped region (see FIG. 7). The pore distribution converges toward zero with increasing depth. The region near the surface during bombardment has a pore density which is almost identical to the pore density near the surface. After the end of plasma treatment the pore density on the surface can be reduced as a result of stress relaxation mechanisms. The pore distribution in the thickness direction with respect to the surface has one steep flank and with respect to the bulk a rather flatter, but continuously decreasing flank (see FIG. 7).

For the pore size, the pore distribution and pore density, similar considerations apply to all methods not produced with plasma.

The reservoir can be designed by controlled use and combination of process parameters. FIG. 7 shows a representation of the concentration of injected nitrogen atoms by plasma as a function of the penetration depth into a silicon oxide layer. It was possible to produce two profiles by variation of the physical parameters. The first profile 11 was produced by more highly accelerated atoms more deeply in the silicon oxide, conversely the profile 12 was produced after altering the process parameters in a lower density. The superposition of the two profiles yields a sum curve 13 which is characteristic for the reservoir. The relationship between the concentration of the injected atom and/or molecule species is evident. Higher concentrations designate regions with higher defect structure, therefore more space to accommodate the subsequent educt. A continuous change of the process parameters which is controlled especially in a dedicated manner during the plasma activation makes it possible to achieve a reservoir with a distribution of the added ions over the depth, which (distribution) is as uniform as possible.

According to one embodiment of the invention, the filling of the reservoir can take place especially advantageously at the same time with the formation of the reservoir by the reservoir being applied as a coating to the first substrate, the coating already encompassing the first educt.

The reservoir is conceivable as a porous layer with a porosity in the nanometer range or as a layer which has channels with a channel density smaller than 10 nm, more preferably smaller than 5 nm, even more preferably smaller than 2 nm, most preferably smaller than 1 nm, most preferably of all smaller than 0.5 nm.

For the step of filling of the reservoir with a first educt or a first group of educts, as claimed in the invention, the following embodiments, also in combination, are conceivable:
  exposing the reservoir to the ambient atmosphere,
  flushing with especially deionized water,
  flushing with a fluid which contains the educt or which consists of it, especially $H_2O$, $H_2O_2$, $NH_4OH$, $O_x^+$
  exposing the reservoir to any gas atmosphere, especially atomic gas, molecular gas, gas mixtures,
  exposing the reservoir to a water vapor- or hydrogen peroxide vapor-containing atmosphere.

The following compounds are possible as educts: $O_x^+$, $O_2$, $O_3$, $N_2$, $NH_3$, $H_2O$, $H_2O_2$, and/or $NH_4OH$.

The use of the above cited hydrogen peroxide vapor is regarded as the preferred version in addition to using water. Hydrogen peroxide furthermore has the advantage of having a greater oxygen to hydrogen ratio. Furthermore, hydrogen peroxide dissociates above certain temperatures and/or via the use of high frequency fields in the MHz range into hydrogen and oxygen.

Mainly when using materials with different coefficients of thermal expansion the use of methods for dissociation of the aforementioned species which do not cause any noteworthy temperature increase or at best a local/specific temperature increase is advantageous. In particular there is microwave irradiation which at least promotes, preferably causes the dissociation.

According to another advantageous embodiment of the invention it is provided that the formation of the growth layer and strengthening of the irreversible bond takes place by diffusion of the first educt into the reaction layer.

According to another advantageous embodiment of the invention it is provided that the formation of the irreversible bond takes place at a temperature of typically less than 300° C., advantageously less than 200° C., more preferably less than 150° C., even more preferably less than 100° C., most preferably at room temperature, especially during a maximum 12 days, more preferably a maximum 1 day, even more preferably a maximum 1 hour, most preferably a maximum 15 minutes. Another advantageous heat treatment method is dielectric heating by microwaves.

Here it is especially advantageous if the irreversible bond has a bond strength of greater than 1.5 $J/m^2$, especially greater than 2 $J/m^2$, preferably greater than 2.5 $J/m^2$.

The bond strength can be increased especially advantageously in that during the reaction, as claimed in the invention, a product with a greater molar volume than the molar volume of the second educt is formed in the reaction layer. In this way growth on the second substrate is effected, as a result of which gaps between the contact surfaces can be closed by the chemical reaction as claimed in the invention. As a result, the distance between the contact surfaces, therefore the average distance, is reduced, and dead spaces are minimized.

To the extent the formation of the reservoir takes place by plasma activation, especially with an activation frequency between 10 and 600 kHz and/or a power density between 0.075 and 0.2 watt/$cm^2$ and/or with pressurization with a pressure between 0.1 and 0.6 mbar, additional effects such as smoothing of the contact surface and also a clearly increased hydrophilicity of the contact surface are effected.

According to another advantageous embodiment of the invention it is provided that the reaction layer consists of an oxidizable material, especially predominantly, preferably essentially completely, of Si, Ge, InP, GaP or GaN or one of the other materials mentioned alternatively in the above list. An especially stable reaction which especially effectively closes the existing gaps is enabled by oxidation.

Here it is especially advantageous as claimed in the invention if between the second contact surface and the reaction layer there is a growth layer, especially predominantly of native oxide material, preferably silicon dioxide. The growth layer is subject to growth caused by the reaction as claimed in the invention. The growth takes place proceeding from the transition Si—$SiO_2$ by re-formation of amorphous $SiO_2$ and the deformation caused thereby, especially bulging, of the growth layer, especially on the interface to the reaction layer, and especially in regions of gaps between the first and the second contact surface. This causes a reduction of the distance or a reduction of the dead space between the two contact surfaces, as a result of which the bond strength between the two substrates is increased. A temperature between 200 and 400° C., preferably roughly 200° C. and 150° C., more preferably a temperature between 150° C. and 100° C., most preferably a temperature between 100° C. and room temperature, is especially advantageous. The growth layer can be divided into several growth regions. The growth layer can at the same time be a reservoir formation layer of the second substrate in which another reservoir which accelerates the reaction is formed.

It is especially advantageous if the growth layer and/or the surface layer has an average thickness "A" between 0.1 nm and 5 nm prior to formation of the irreversible bond. The thinner the growth layer and/or the surface layer, the more quickly and easily the reaction takes place between the first and the second educt through the growth layer and/or the surface layer, especially by diffusion of the first educt through the growth layer and/or the surface layer to the reaction layer. Furthermore the activation of the surface can promote the diffusion by the generation of point defects. The diffusion rate of the educts through the growth layer is increased by the growth layer (which has optionally been thinned and thus is very thin at least at the beginning of the formation of the permanent bond or at the start of the reaction). This leads to a lower transport time of the educts at the same temperature.

Here thinning can play a decisive part since the reaction can be further accelerated hereby and/or the temperature further reduced. Thinning can be done especially by etching, preferably in a moist atmosphere, still more preferably in-situ. Alternatively etching takes place especially by dry etching, preferably in-situ. As used herein, "in-situ" means performance in the same chamber in which at least one previous and/or one following step is/are done. Wet etching takes place with chemicals in the vapor phase, while dry etching takes place with chemicals in the liquid state. To the extent the growth layer consists of silicon dioxide, etching with hydrofluoric acid or diluted hydrofluoric acid can be done. To the extent the growth layer consists of pure Si, etching can be done with KOH.

According to one embodiment of the invention it is advantageously provided that the formation of the reservoir is carried out in a vacuum. Thus contamination of the reservoir with unwanted materials or compounds can be avoided.

In another embodiment of the invention, it is advantageously provided that filling of the reservoir takes place by one or more of the steps cited below:
  exposing the first contact surface to the atmosphere, for filling the reservoir with atmospheric humidity and/or oxygen contained in the air,
  exposing the first contact surface to a fluid consisting especially predominantly, preferably almost completely, of especially deionized $H_2O$ and/or $H_2O_2$,
  exposing the first contact surface to $N_2$ gas and/or $O_2$ gas and/or Ar gas and/or forming gas, especially consisting of 95% Ar and 5% $H_2$, especially with an ion energy in the range from 0 to 2000 eV,
  vapor deposition for filling the reservoir with any already named educt.

According to another advantageous embodiment of the invention it is provided that the formation and filling of a reservoir take place additionally on the second contact surface, especially in the growth layer, and the formation of the permanent bond is additionally strengthened by reaction of the first educt with a second educt which is contained in a reaction layer of the first substrate (1).

It is especially effective for the process sequence if the reservoir is formed preferably in a thickness R between 0.1 nm and 25 nm, more preferably between 0.1 nm and 15 nm, even more preferably between 0.1 nm and 10 nm, most preferably between 0.1 nm and 5 nm. Furthermore, according to one embodiment of the invention it is advantageous if the average distance B between the reservoir and the reaction layer immediately before formation of the irreversible bond is between 0.1 nm and 15 nm, especially between 0.5 nm and 5 nm, preferably between 0.5 nm and 3 nm. The distance B can be influenced or produced as claimed in the invention by the thinning.

A device for executing the method is formed, as claimed in the invention, with a chamber for forming the reservoir, a chamber provided especially separately for filling the reservoir, and an especially separately provided chamber for forming the prebond, all of which chambers are connected directly to one another via a vacuum system.

In another embodiment the filling of the reservoir can also take place directly via the atmosphere, therefore either in a chamber which can be opened to the atmosphere or simply on a structure which does not have jacketing but can handle the wafer semi-automatically and/or completely automatically.

Other advantages, features and details of the invention will become apparent from the following description of preferred exemplary embodiments and using the drawings.

BRIEF DESCRIPTION OF THE DRAWINGS

The same or equivalent features are identified with the same reference numbers in the figures.

DETAILED DESCRIPTION OF PREFERRED EMBODIMENTS

Figure 1A:
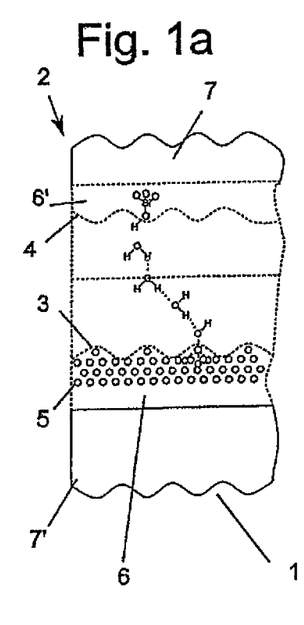
FIG. 1a shows a first step of the method as claimed in the invention immediately after the first substrate makes contact with the second substrate.

In the situation which is shown in FIG. 1a only one extract of the chemical reactions which proceed during or immediately after the prebond step between a first contact surface 3 of a first substrate 1 and a second contact surface 4 of a second substrate 2 is shown. Surface layers 6, 6' adjoin the contact surfaces 3, 4 respectively and are formed from oxidizable, native silicon dioxide and are very thin. The surfaces are terminated with polar OH groups and are accordingly hydrophilic. The first substrate 1 and the second substrate 2 are held by the force of attraction of the hydrogen bridges between the OH groups present on the surface and the $H_2O$ molecules and also between the $H_2O$ molecules alone. The hydrophilicity of at least the first contact surface 3 is increased by plasma treatment of the first contact surface 3 in a preceding step.

It is especially advantageous to additionally subject the second contact surface 4 to plasma treatment, especially at the same time with the plasma treatment of the first contact surface 3 according to the alternative embodiment.

Figure 1B:
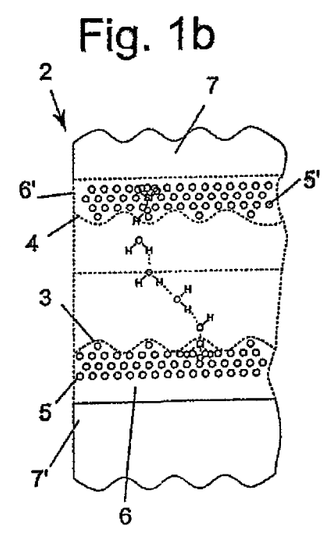
FIG. 1b shows an alternative first step of the method as claimed in the invention immediately after the first substrate makes contact with the second substrate.

A reservoir 5 in the surface layer 6 consisting of native silicon dioxide, as well as in the alternative embodiment according to FIG. 1b a second opposing reservoir 5' in the surface layer 6', are formed as claimed in the invention by plasma treatment. Plasma treatment with $O_2$ ions with ion energies in the range between 0 and 2000 eV yields an average thickness R of the reservoir 5 of roughly 10 nm, the ions forming channels or pores in the surface layer 6 (and optionally the surface layer 6').

Between the reservoir formation layer 6 and the reaction layer 7 there is a growth layer 8 on the second substrate 2 which can be at the same time at least partially the reservoir formation layer 6'. Accordingly there can additionally be another growth layer between the reservoir formation layer 6' and the reaction layer 7'.

Likewise the reservoir 5 (and optionally the reservoir 5') is filled at least largely with $H_2O$ as the first educt prior to the step shown in FIG. 1 and after plasma treatment. Reduced species of the ions present in the plasma process can also be located in the reservoir, especially $O_2$, $N_2$, $H_2$, Ar.

The contact surfaces 3, 4 still have a relatively wide gap, especially dictated by the water present between the contact surfaces 3, 4, after making contact in the stage shown in FIGS. 1a and 1b. Accordingly the existing bond strength is relatively low and is roughly between 100 $mJ/cm^2$ and 300 $mJ/cm^2$, especially more than 200 $mJ/cm^2$. In this connection the prior plasma activation plays a decisive part, especially due to the increased hydrophilicity of the plasma-activated first contact surface 3 and a smoothing effect which is caused by the plasma activation.

Figures 2A, 2B:
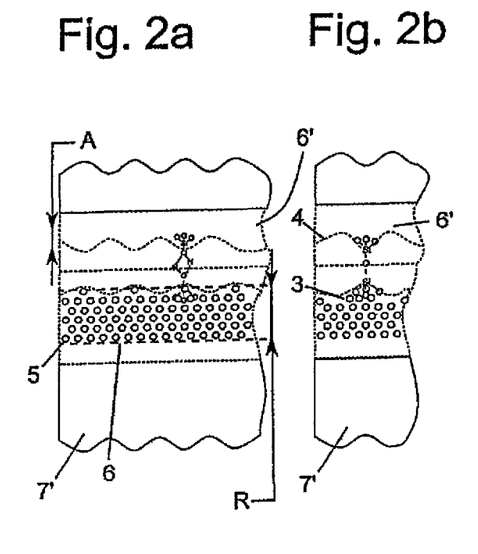
FIGS. 2a and 2b show other steps of the method as claimed in the invention for forming a higher bond strength.

The process which is shown in FIG. 1 and which is called prebond can preferably proceed at ambient temperature or a maximum 50° C. FIGS. 2a and 2b show a hydrophilic bond, the Si—O—Si bridge arising with splitting of water by —OH terminated surfaces. The processes in FIGS. 2a and 2b last roughly 300 h at room temperature. At 50° C. roughly 60 h. The state in FIG. 2b occurs at the indicated temperatures without producing the reservoir 5 (or reservoirs 5, 5').

Between the contact surfaces 3, 4, $H_2O$ molecules are formed and provide at least partially for further filling in the reservoir 5 to the extent there is still free space. The other $H_2O$ molecules are removed. In the step according to FIG. 1 roughly 3 to 5 individual layers of OH groups or $H_2O$ are present and 1 to 3 monolayers of $H_2O$ are removed or accommodated in the reservoir 5 from the step according to FIG. 1 to the step according to FIG. 2a.

In the step shown in FIG. 2a the hydrogen bridge bonds are now formed directly between siloxane groups, as a result of which a greater bond force arises. This draws the contact surfaces 3, 4 more strongly to one another and reduces the distance between the contact surfaces 3, 4. Accordingly there are only 1 to 2 individual layers of OH groups between the contact surfaces 1, 2.

Figures 3, 4:
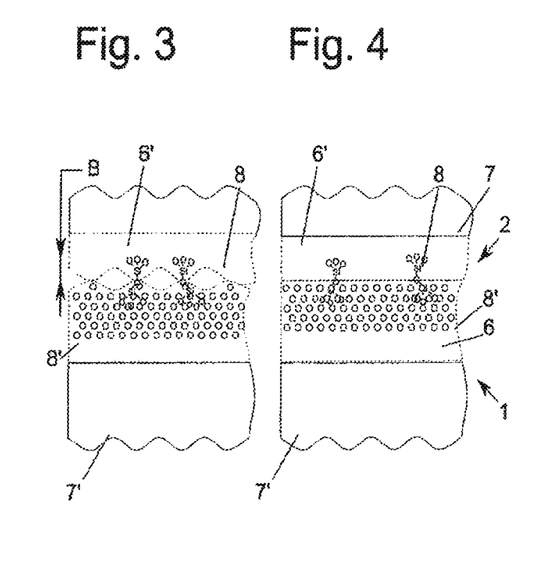
FIG. 3 shows another step of the method as claimed in the invention which follows the steps according to FIG. 1, FIG. 2a and FIG. 2b, with substrate contact surfaces which are in contact.
FIG. 4 shows a step as claimed in the invention for formation of an irreversible/permanent bond between the substrates.

In the step shown in FIG. 2b, in turn with separation of $H_2O$ molecules according to the reaction which has been inserted below, covalent compounds in the form of silanol groups are now formed between the contact surfaces 3, 4 which lead to a much stronger bond force and require less space so that the distance between the contact surfaces 3, 4 is further reduced until finally the minimum distance shown in FIG. 3 is reached based on the contact surfaces 3, 4 directly meeting one another:

Si—OH+HO—Si ↔ Si—O—Si+$H_2O$

Up to stage 3, especially due to the formation of the reservoir 5 (and optionally of the additional reservoir 5'), it is not necessary to unduly increase the temperature, rather to allow it to proceed even at room temperature. In this way an especially careful progression of the process steps according to FIG. 1 to FIG. 3 is possible.

Figure 5:
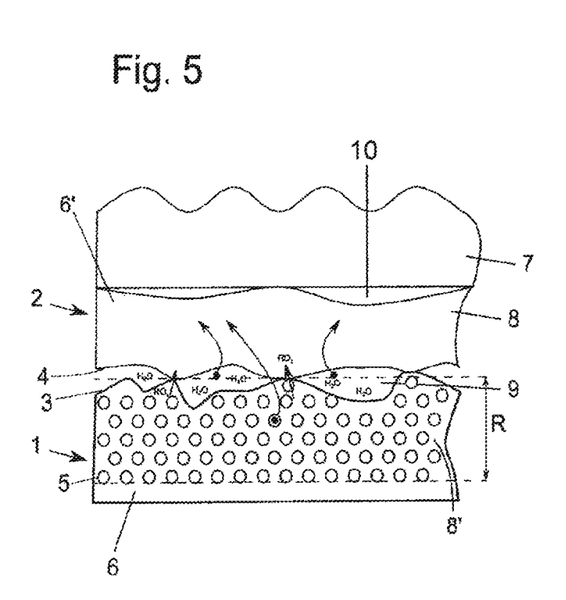
FIG. 5 shows an enlargement of the chemical/physical processes which proceed on the two contact surfaces during the steps according to FIG. 3 and FIG. 4.
Figure 6:
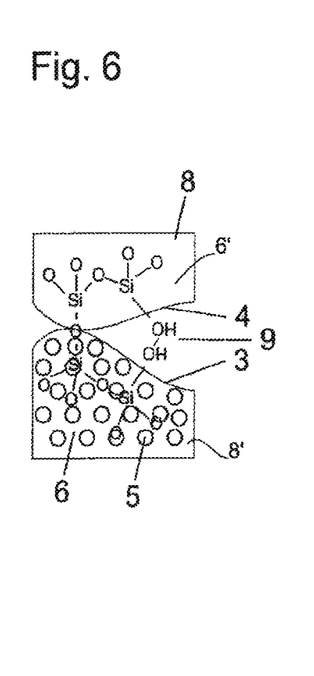
FIG. 6 shows a further enlargement of the chemical/physical processes which proceed on the interface between the two contact surfaces during the steps according to FIG. 3 and FIG. 4

In the process step shown in FIG. 4, the temperature is preferably increased to a maximum 500° C., more preferably to a maximum 300° C., even more preferably to a maximum 200° C., most preferably to a maximum 100° C., most preferably of all not above room temperature in order to form an irreversible or permanent bond between the first and the second contact surface. These temperatures which are relatively low, in contrast to the prior art, are only possible because the reservoir 5 (and optionally in addition the reservoir 5') encompasses the first educt for the reaction as shown in FIGS. 5 and 6:

$$Si + 2H_2O \rightarrow SiO_2 + 2H_2$$

Between the second contact surface 4 and the reaction layer 7 there is a growth layer 8 which can be identical to the surface layer 6'. To the extent a reservoir 5' has been formed according to the second embodiment, between the first contact surface 3 and another reaction layer 7' which corresponds to the reaction layer 7 there is also another growth layer 8', the reactions proceeding essentially reciprocally. By increasing the molar volume and diffusion of the $H_2O$ molecules, especially on the interface between the surface layer 6' and the reaction layer 7 (and optionally in addition on the interface between the surface layer 6 and the reaction layer 7'), volume in the form of a growth layer 8 increases, due to the objective of minimizing the free Gibb's enthalpy enhanced growth taking place in regions in which gaps 9 are present between the contact surfaces 3, 4. The gaps 9 are closed by the increase in the volume of the growth layer 8. More exactly:

At the aforementioned slightly increased temperatures, $H_2O$ molecules diffuse as the first educt from the reservoir 5 to the reaction layer 7 (and optionally from the reservoir 5' to the reaction layer 7'). This diffusion can take place either via a direct contact of the surface layer 6 and growth layer 8 which are formed as native oxide layers (or via a gap 9 or from a gap 9 which is present between the oxide layers). There, silicon dioxide, therefore a chemical compound with a greater molar volume than pure silicon, is formed as a reaction product 10 of the aforementioned reaction from the reaction layer 7. The silicon dioxide grows on the interface of the reaction layer 7 with the growth layer 8 (or the interface of the reaction layer 7' with the growth layer 8') and thus deforms the layer of the growth layer 8 formed as native oxide in the direction of the gaps 9. Here $H_2O$ molecules from the reservoir are also required.

Due to the existence of the gaps which are in the nanometer range, there is the possibility of bulging of the native oxide layer (growth layer 8 and optionally growth layer 8'), as a result of which stresses on the contact surfaces 3, 4 can be reduced. In this way the distance between the contact surfaces 3, 4 is reduced, as a result of which the active contact surface and thus the bond strength are further increased. The weld connection which has arisen in this way, which closes all pores, and which forms over the entire wafer, in contrast to the products in the prior art which are partially not welded, fundamentally contributes to increasing the bond force. The type of bond between the two native silicon oxide surfaces which are welded to one another is a mixed form of covalent and ionic portion.

The aforementioned reaction of the first educt ($H_2O$) with the second educt (Si) takes place in the reaction layer 7 especially quickly or at temperatures as low as possible to the extent an average distance B between the first contact surface 3 and the reaction layer 7 is as small as possible.

Therefore the choice of the first substrate 1 and the selection/pretreatment of the second substrate 2 which consists of a reaction layer 7 (and optionally 7') of silicon and a native oxide layer as thin as possible as a growth layer 8 (and optionally 8') are decisive. A native oxide layer as thin as possible is provided as claimed in the invention for two reasons. The growth layer 8 is very thin, especially due to additional thinning, so that it can bulge through the newly formed reaction product 10 on the reaction layer 7 toward the surface layer 6 of the opposite substrate 1, which surface layer is likewise made as a native oxide layer, predominantly in regions of the nanogaps 9. Furthermore, diffusion paths as short as possible are desired in order to achieve the desired effect as quickly as possible and at a temperature as low as possible. The first substrate 1 likewise consists of a silicon layer and a native oxide layer as thin as possible present on it as a surface layer 6 in which the reservoir 5 is formed at least partially or completely.

The reservoir 5 (and optionally the reservoir 5') as claimed in the invention is filled at least accordingly with the amount of the first educt which is necessary to close the nanogaps 9 so that an optimum growth of the growth layer 8 (and optionally 8') can take place to close the nanogaps 9 in a time as short as possible and/or at a temperature as low as possible.

REFERENCE NUMBER LIST

1 first substrate
2 second substrate
3 first contact surface
4 second contact surface
5, 5' reservoir
6, 6' surface layer
7, 7' reaction layer
8, 8' growth layer
9 nanogaps
10 reaction product
11 first profile
12 second profile
13 sum curve
A average thickness
B average distance
R average thickness

The invention claimed is:

1. A method of bonding a first contact surface of a first substrate to a second contact surface of a second substrate, the method comprising:
   forming:
     a first surface layer of native silicon oxide material, the formed first surface layer adjoining the first contact surface; and
     a second surface layer of native silicon oxide material, the formed second surface layer adjoining the second contact surface;
   thinning the formed first and second surface layers;
   forming a first reservoir in the thinned first surface layer and a second reservoir in the thinned second surface layer;
   at least partially filling the formed first and second reservoirs with one or more first educts;
   prebonding the first substrate to the second substrate, the prebonding comprising respectively contacting portions of the first contact surface with portions of the second contact surface to form corresponding prebond connections between the respectively contacted portions of the first and second contact surfaces and gaps between the first and second contact surfaces at areas located between the respectively contacted portions of the first and second contact surfaces; and
   forming a permanent bond between the first substrate and the second substrate, the forming comprising:
     permanently bonding the respectively contacted portions of the first and second contact surfaces; and initiating an oxidation reaction between the first educts filled in the first reservoir and silicon contained in a reaction layer of the second substrate to deform a portion of the reaction layer of the second substrate located between the reaction layer of the second substrate and the second surface layer of the second substrate into a growth layer of native silicon oxide material that is oxidized from the silicon contained in the reaction layer of the second substrate, the growth layer growing to bulge the second surface layer of the second substrate toward the first contact surface to close the formed gaps between the first and second contact surfaces and strengthen a bond strength of the permanent bond between the first substrate and the second substrate to be greater than 1.5 J/m$^2$ and less than 7.5 J/m$^2$, wherein a period between the thinning of the formed first and second surface layers and the contacting of the portions of the first contact surface with the portions of the second contact surface is less than two hours.

2. The method as claimed in claim 1, wherein the bulged surface layer fills the formed gaps.

3. The method as claimed in claim 1, wherein the permanent bond is additionally strengthened by an oxidation reaction between the first educts filled in the second reservoir with silicon contained in a reaction layer of the first substrate.

4. The method as claimed in claim 1, wherein the permanently bonding and the initiating is conducted at a temperature that is equal to or less than 100° C.

5. The method as claimed in claim 1, wherein the permanently bonding and the initiating is conducted at room temperature.

6. The method as claimed in claim 1,
wherein, prior to the forming of the permanent bond, the first and second surface layers have respective average thicknesses in a range of 0.1 nm to 5 nm.

7. The method as claimed in claim 6, wherein the first and second reservoirs are each porous layers with a porosity less than 10 nm.

8. A method of bonding a first contact surface of a first substrate to a second contact surface of a second substrate, the method comprising:
forming:
a first reservoir in a first surface layer formed of native silicon oxide material, the formed first surface layer adjoining the first contact surface, the forming of the first reservoir comprising forming a plurality of first channels in the first reservoir, a density of the first channels in the first reservoir being less than 10 nm; and a second reservoir in a second surface layer formed of native silicon oxide material, the formed second surface layer adjoining the second contact surface, the forming of the second reservoir comprising forming a plurality of second channels in the formed second reservoir, a density of the second channels in the second reservoir being less than 10 nm;

at least partially filling the formed first and second reservoirs with one or more first educts;

prebonding the first substrate to the second substrate, the prebonding comprising respectively contacting portions of the first contact surface with portions of the second contact surface to form corresponding prebond connections between the respectively contacted portions of the first and second contact surfaces and gaps between the first and second contact surfaces at areas located between the respectively contacted portions of the first and second contact surfaces; and forming a permanent bond between the first substrate and the second substrate, the forming comprising:
permanently bonding the respectively contacted portions of the first and second contact surfaces; and
initiating an oxidation reaction between the first educts filled in the first reservoir and silicon contained in a reaction layer of the second substrate to deform a portion of the reaction layer of the second substrate located between the reaction layer of the second substrate and the second surface layer of the second substrate into a growth layer of native silicon oxide material that is oxidized from the silicon contained in the reaction layer of the substrate, the growth layer growing to bulge the second surface layer of the second substrate toward the first contact surface to close the formed gaps between the first and second contact surfaces and strengthen a bond strength of the permanent bond between the first substrate and the second substrate to be greater than 1.5 J/m$^2$ and less than 7.5 J/m$^2$.

* * * * *